(12) United States Patent
Kang et al.

(10) Patent No.: US 6,277,712 B1
(45) Date of Patent: Aug. 21, 2001

(54) MULTILAYERED WAFER WITH THICK SACRIFICIAL LAYER USING POROUS SILICON OR POROUS SILICON OXIDE AND FABRICATION METHOD THEREOF

(75) Inventors: Sung-gyu Kang, Kimcheon; Ki Bang Lee, Seoul; Jae-joon Choi, Sungnam; Hee-moon Jeong, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/540,552

(22) Filed: Mar. 31, 2000

(30) Foreign Application Priority Data

Mar. 31, 1999 (KR) .................................................. 99-11269

(51) Int. Cl.[7] .................................................. H01L 21/322
(52) U.S. Cl. ......................... 438/471; 438/476; 438/764; 438/795
(58) Field of Search .............................. 437/228; 257/369, 257/634; 216/57; 438/624, 626, 471

(56) References Cited

U.S. PATENT DOCUMENTS

| | | | |
|---|---|---|---|
| 5,393,712 | * 2/1995 | Rostoker | 438/471 |
| 5,569,626 | * 10/1996 | Kurtz | 437/228 |
| 5,598,026 | * 1/1997 | Kapoor | 257/634 |
| 5,616,519 | * 4/1997 | Ping | 438/626 |
| 5,639,692 | * 6/1997 | Teong | 438/624 |
| 5,932,919 | * 8/1999 | Schwalke | 257/369 |
| 6,077,776 | * 6/2000 | Cho | 438/647 |
| 6,126,847 | * 10/2000 | Thakur | 216/57 |

OTHER PUBLICATIONS

Document ID: JP 2000332223 A, Author: J. Choi, H Geong, S Kang, K B Lee, Tittle: Multilayered wafer with thick sacrificial layer used, Source:Derwent—ACC_No. 2000–674016, pp: 1–5.*

* cited by examiner

Primary Examiner—John F. Niebling
Assistant Examiner—Andre C Stevenson
(74) Attorney, Agent, or Firm—Burns, Doane, Swecker & Mathis L.L.P.

(57) ABSTRACT

A multilayered wafer with a thick sacrificial layer, which is obtained by forming a sacrificial layer of oxidized porous silicon or porous silicon and growing an epitaxial polysilicon layer on the sacrificial layer, and a fabrication method thereof are provided. The multilayered wafer with a thick sacrificial layer adopts a porous silicon layer or an oxidized porous silicon layer as a sacrificial layer such that a sufficient gap can be obtained between a substrate and a suspension structure upon the manufacture of the suspension structure of a semiconductor actuator or a semiconductor inertia sensor. Also, in a fabrication method of the wafer according to the present invention, a $p^+$-type or $n^+$-type wafer doped at a high concentration is prepared for, and then a thick porous silicon layer can be obtained simply by anodic-bonding the surface of the wafer. Also, when polysilicon is grown on a porous silicon layer by an epitaxial process, it is grown faster than when single crystal silicon is grown.

12 Claims, 3 Drawing Sheets

US 6,277,712 B1

MULTILAYERED WAFER WITH THICK SACRIFICIAL LAYER USING POROUS SILICON OR POROUS SILICON OXIDE AND FABRICATION METHOD THEREOF

BACKGROUND OF THE INVENTION

1. Field of the Invention

The present invention relates to a multilayered wafer having a thick sacrificial layer, which is obtained by forming a sacrificial layer of oxidized porous silicon or porous silicon and growing an epitaxial polysilicon layer on the sacrificial layer, and a fabrication method thereof.

2. Description of the Related Art

FIG. 1 is a cross-sectional view illustrating the stacked structure of a conventional silicon on insulator (SOI) wafer. As shown in FIG. 1, the conventional SOI wafer has a stacked structure in which an oxide layer 3 is formed on a substrate wafer 1 and a single crystal silicon wafer 6 is formed on the oxide layer 3. Here, the oxide layer 3, which is a sacrificial layer, is formed by thermal oxidization, so it is difficult to form a sacrificial layer having a thickness of 1 µm or more. Thus, when the oxide layer is used to make a structure such as a cantilever or a bridge, a completed structure frequently sticks to a substrate which lies under the structure, since the gap between the structure and the substrate is narrow. Also, in the case of a moving structure, great air damping is produced due to the short distance between the structure and the substrate. Also, since the silicon oxide layer is formed by thermal oxidization, it takes a long time to fabricate the structure. Furthermore, since the structure is fabricated by attaching another silicon wafer onto oxidized substrate silicon, that is, since two wafers are used, the fabrication cost is increased.

SUMMARY OF THE INVENTION

To solve the above problems, an objective of the present invention is to provide a multilayered wafer obtained by forming a porous silicon layer having a thickness of several tens of micrometers on a p$^+$-type or n$^+$-type substrate doped at a high concentration through anodic bonding of the surface of the substrate and growing an epitaxial polysilicon on the porous silicon, or a multilayered wafer having a thick sacrificial layer, which is obtained by depositing a polysilicon seed layer on oxidized porous silicon by chemical vapor deposition (CVD) and growing an epitaxial polysilicon layer on the polysilicon seed layer.

To achieve the above objective, a multilayered wafer with a thick sacrificial layer according to an embodiment is provided, including: a silicon wafer for use as a substrate; a sacrificial layer formed of porous silicon on the silicon wafer; and a polysilicon layer formed on the sacrificial layer.

In the multilayered wafer, the silicon wafer is preferably doped with p$^+$-type or n$^+$-type impurities, and the sacrificial layer and the polysilicon layer may be stacked several times.

To achieve the above objective, a method of fabricating the multilayered wafer with a thick sacrificial layer according to an embodiment is provided, including: (a) preparing for a p$^+$-type or n$^+$-type wafer as a substrate wafer; (b) forming a porous silicon layer having a predetermined thickness by anodic bonding the substrate wafer; and (c) growing an epitaxial polysilicon layer on the porous silicon layer.

In this method, the thickness of the porous silicon layer in the step (b) is preferably several micrometers to several tens of micrometers, and the steps (b) and (c) may be repeated.

To achieve the above objective, a multilayered wafer with a thick sacrificial layer according to another embodiment is provided, including: a silicon wafer for use as a substrate; a sacrificial layer formed of porous silicon oxide on the silicon wafer; and a polysilicon layer formed on the sacrificial layer.

In this multilayered wafer, the silicon wafer is preferably doped with p$^+$-type or n$^+$-type impurities, and the sacrificial layer and the polysilicon layer may be stacked several times.

To achieve the above objective, a method of fabricating the multilayered wafer with a thick sacrificial layer according to another embodiment, is provided including: (a) preparing for a p$^+$-type or n$^+$-type wafer as a substrate wafer; (b) forming a porous silicon layer having a predetermined thickness by anodic bonding the substrate wafer; (c) forming a porous silicon oxide layer by oxidizing the porous silicon layer; (d) forming a polysilicon seed layer on the porous silicon oxide layer; and (e) growing an epitaxial polysilicon layer on the porous silicon oxide layer.

In this method, the thickness of the porous silicon layer is preferably several micrometers to several tens of micrometers, and the steps (b) through (e) may be repeated.

BRIEF DESCRIPTION OF THE DRAWINGS

The above objective and advantages of the present invention will become more apparent by describing in detail preferred embodiments thereof with reference to the attached drawings in which:

FIGS. 4A through 4F are cross-sectional views illustrating a method of fabricating a multilayered wafer with a thick sacrificial layer according to the present invention, wherein FIG. 4A illustrates a start wafer;

FIG. 4B illustrates the top portion of the start wafer which has turned into porous silicon by anode reaction;

FIG. 4C illustrates oxidized porous silicon (OPS) into which porous silicon turns after undergoing oxidation;

FIG. 4D illustrates an epitaxial polysilicon layer formed on the porous silicon;

FIG. 4E illustrates a polysilicon seed layer formed on the oxidized porous silicon (OPS) by chemical vapor deposition (CVD); and FIG. 4F illustrates an epitaxial polysilicon layer grown on the polysilicon seed layer.

DESCRIPTION OF THE PREFERRED EMBODIMENTS

In a multilayered wafer with a thick sacrificial layer according to the present invention, a sacrificial layer which is etched upon fabrication of a suspension structure is thickened to solve problems such as sticking of the suspension structure to a substrate bottom or air damping in a semiconductor actuator, a semiconductor acceleration sensor, or the like, since a big gap between the structure and the bottom is preferred to solve the above problems.

Such a thick sacrificial layer can be obtained by the following method.

That is, porous silicon having a size of several tens of micrometers, which is to be used as a sacrificial layer, is formed within a short period of time when a p$^+$-type or n$^+$-type wafer doped at a high concentration is anodized. When the porous silicon is thermally oxidized, the entire surface of the porous silicon is oxidized by virtue of the wide surface area of the porous silicon, about 200 m$^2$/cm$^3$. In this way, a thick oxide layer is easily obtained.

Figure 1:
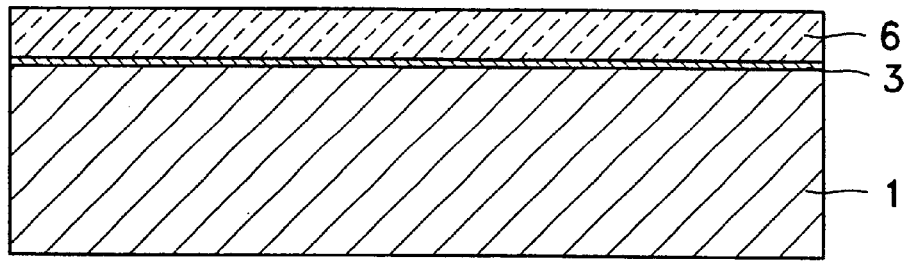
FIG. 1 is a cross-sectional view of a conventional silicon on insulator (SOI) wafer.
Figure 2:
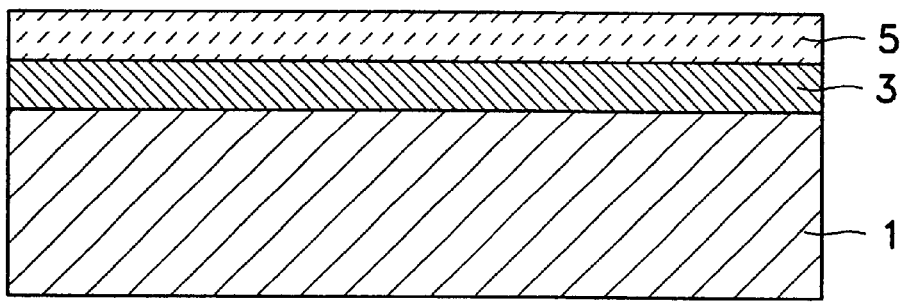
FIG. 2 is a cross-sectional view of a multilayered wafer with a thick sacrificial layer formed of porous silicon oxide, according to the present invention.
Figure 3:
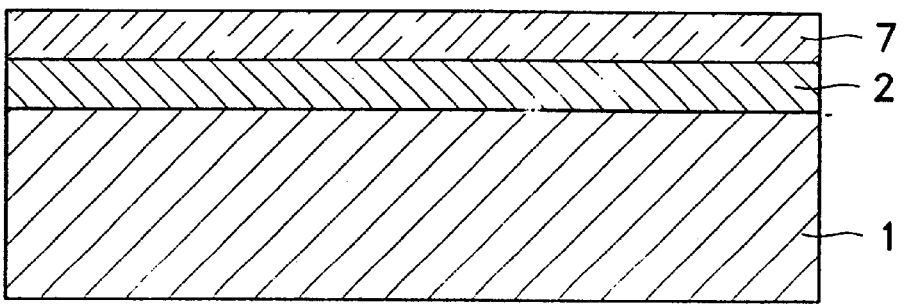
FIG. 3 is a cross-sectional view of a multilayered wafer with a thick sacrificial layer formed of porous silicon, according to the present invention.

FIGS. 2 and 3 are cross-sectional views illustrating different embodiments of a multilayered wafer with a thick sacrificial layer according to the present invention. FIG. 2 refers to an embodiment in which a sacrificial layer 3 of porous silicon oxide is formed on a substrate wafer 1, and FIG. 3 refers to an embodiment in which a sacrificial layer 2 of porous silicon is formed on a substrate wafer 1. In FIGS. 2 and 3, polysilicon layers 7 and 5 are formed on the sacrificial layers 2 and 3, respectively. A stack of the sacrificial layer 2 and the polysilicon layer 7 can be repeated several times, and likewise for a stack of the sacrificial layer 3 and the polysilicon layer 5.

As described in these embodiments, when a suspension structure such as an acceleration sensor is fabricated by manufacturing a multilayered wafer using a thick sacrificial layer, the suspension structure is far away from a substrate bottom, such that problems such as sticking of a structure to a substrate or air damping occurring in the case of a moving structure can be solved. Also, when through etching is achieved by bulk-etching the rear surface of a substrate upon the manufacture of the structure, a sacrificial layer formed of porous silicon or oxidized porous silicon is prevented from being broken, because it is thick. In the manufacture of a polysilicon layer on the top portion of a wafer (when oxidized porous silicon is used to form a sacrificial layer, a polysilicon seed layer is first deposited on the oxidized porous silicon), when polycrystal silicon is grown by an epitaxial process, it is grown faster than when single crystal silicon is grown. Thus, the polycrystal silicon is preferable to the single crystal silicon in terms of time. In the prior art, two wafers are required to use a silicon direct bonding (SDB) process. However, in the present invention, only a sheet of silicon wafer is required. Also, a process for fabricating a multilayered wafer with a thick artificial layer is simpler than an existing SOI wafer fabrication process, so that it is appropriate for mass production. Consequently, the manufacturing cost is reduced.

As described above, in the present invention, porous silicon can be adopted as a sacrificial layer, or oxidized porous silicon obtained by thermally oxidizing porous silicon can be adopted as the sacrificial layer. The sequence of a wafer fabrication process according to the present invention will now be described referring to FIGS. 4A through 4F. First, a case of forming a sacrificial layer of porous silicon will be described, and then, a case of forming the sacrificial layer of oxidized porous silicon will be described.

Figure 4A:
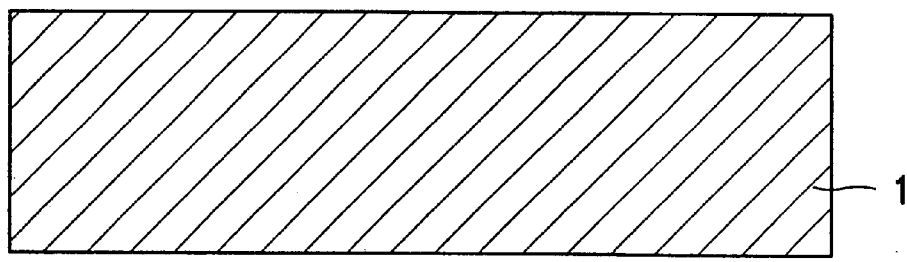
Figure 4B:
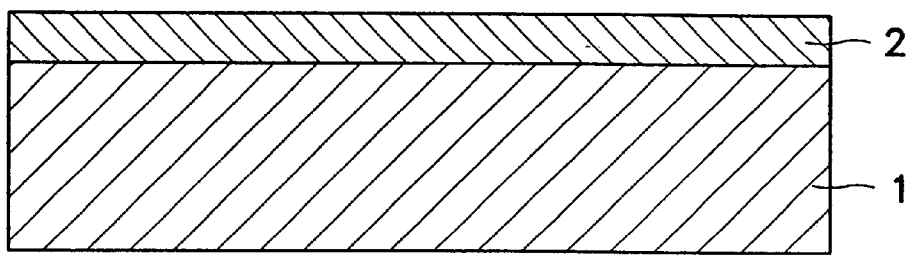
Figure 4C:
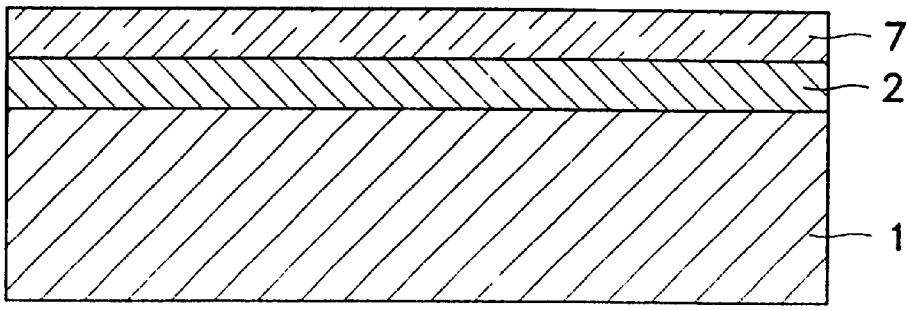

1. The Process Order in the Case that a Sacrificial Layer is Formed of Porous Silicon First, as shown in FIG. 4A, a p$^+$-type or n$^+$-type wafer doped at a high concentration is prepared for a substrate wafer 1. Then, as shown in FIG. 4B, a porous silicon layer 2 having a thickness of several micrometers to several tens of micrometers is formed by anodic-bonding the surface of the substrate wafer 1. Next, as shown in FIG. 4C, an epitaxial polysilicon layer 7 is grown on the porous silicon layer 2, thereby completing a wafer according to an embodiment in which a sacrificial layer is formed of porous silicon. Here, a multilayered wafer having a very thick stack can be fabricated by repeating the porous silicon layer forming process and the polycrystal silicon layer forming process several times.

Figure 4D:
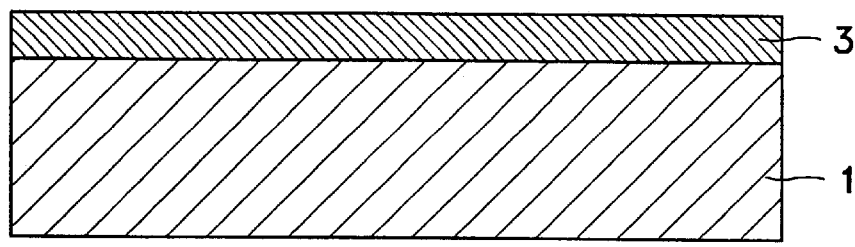
Figure 4E:
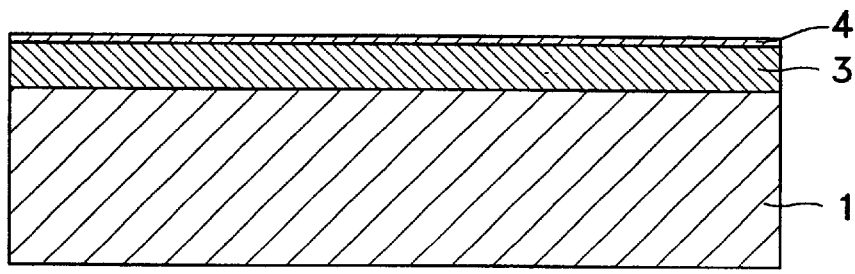
Figure 4F:
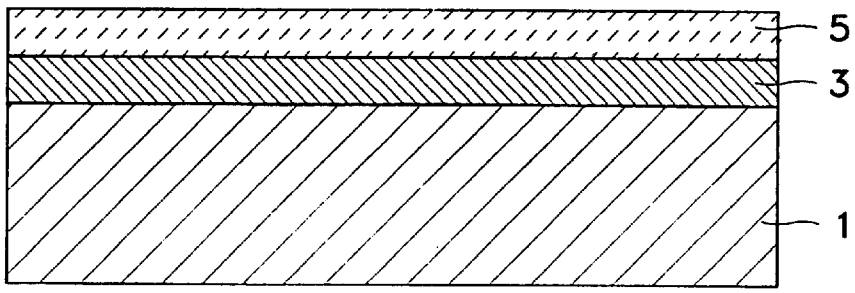

2. The Process Order in the Case that a Sacrificial Layer is Formed of Oxidized Porous Silicon First, as shown in FIG. 4A, a p$^+$-type or n$^+$-type wafer doped at a high concentration is prepared for a substrate wafer 1. Then, as shown in FIG. 4B, a porous silicon layer 2 having a thickness of several micrometers to several tens of micrometers is formed by anodic-bonding the surface of the substrate wafer 1. Next, as shown in FIG. 4D, the porous silicon layer 2 turns into a porous silicon oxide layer 3 through thermal oxidation. Thereafter, as shown in FIG. 4E, a polysilicon seed layer 4 is deposited on the porous silicon oxide layer 3 by chemical vapor deposition (CVD). The porosity of porous silicon varies according to the concentration of a hydrofluoric acid and a current density. When about 55% porosity is achieved, a porous silicon oxide layer can be grown without deformation of a wafer due to bulk expansion occurring upon oxidization. Following this, as shown in FIG. 4F, the polysilicon seed layer 4 is grown to a polysilicon layer 5, thereby completing a wafer according to an embodiment in which a sacrificial layer is formed of oxidized porous silicon. Here, a multilayered wafer having a very thick stack can be fabricated by repeating processes from the porous silicon layer forming process to the polycrystal silicon layer forming process several times.

As described above, a multilayered wafer having a thick sacrificial layer according to the present invention adopts a porous silicon layer or an oxidized porous silicon layer as a sacrificial layer, such that a sufficient gap can be obtained between a substrate and a suspension structure upon the manufacture of the suspension structure of a semiconductor actuator or a semiconductor inertia sensor. Thus, problems such as sticking or air resistance can be solved. Also, in a fabrication method of the wafer according to the present invention, a p$^+$-type or n$^+$-type wafer doped at a high concentration is prepared for, and then a thick porous silicon layer can be obtained simply by anodic-bonding the surface of the wafer. Also, when polysilicon is grown on a porous silicon layer by an epitaxial process, it is grown faster than when single crystal silicon is grown. Thus, polycrystal silicon is preferable to single crystal silicon in terms of time.

What is claimed is:

1. A multilayered wafer with a thick sacrificial layer, comprising:
   a silicon wafer for use as a substrate;
   a sacrificial layer formed of porous silicon on the silicon wafer; and
   a polysilicon layer formed on the sacrificial layer.

2. The multilayered wafer with a thick sacrificial layer of claim 1, wherein the silicon wafer is doped with p$^+$-type or n$^+$-type impurities.

3. The multilayered wafer with a thick sacrificial layer of claim 1 or 2, wherein the sacrificial layer and the polysilicon layer are stacked several times.

4. A method of fabricating a multilayered wafer with a thick sacrificial layer, the method comprising:
   (a) preparing for a p$^+$-type or n$^+$-type wafer as a substrate wafer;
   (b) forming a porous silicon layer having a predetermined thickness by anodic bonding the substrate wafer; and
   (c) growing an epitaxial polysilicon layer on the porous silicon layer.

5. The method of claim 4, wherein in step (b), the thickness of the porous silicon layer is several micrometers to several tens of micrometers.

6. The method of claim 4 or 5, wherein the steps (b) and (c) are repeated.

7. A multilayered wafer with a thick sacrificial layer, comprising:

a silicon wafer for use as a substrate;

a sacrificial layer formed of porous silicon oxide on the silicon wafer; and a polysilicon layer formed on the sacrificial layer.

8. The multilayered wafer with a thick sacrificial layer of claim 7, wherein the silicon wafer is doped with $p^+$-type or $n^+$-type impurities.

9. The multilayered wafer with a thick sacrificial layer of claim 7 or 8, wherein the sacrificial layer and the polysilicon layer are stacked several times.

10. A method of fabricating a multilayered wafer with a thick sacrificial layer, the method comprising:

(a) preparing for a $p^+$-type or $n^+$-type wafer as a substrate wafer;

(b) forming a porous silicon layer having a predetermined thickness by anodic bonding the substrate wafer;

(c) forming a porous silicon oxide layer by oxidizing the porous silicon layer;

(d) forming a polysilicon seed layer on the porous silicon oxide layer; and (e) growing an epitaxial polysilicon layer on the porous silicon oxide layer.

11. The method of claim 10, wherein the thickness of the porous silicon layer is several micrometers to several tens of micrometers.

12. The method of claim 10 or 11, wherein the steps (b) through (e) are repeated.

* * * * *